United States Patent
Roca I Cabarrocas et al.

(10) Patent No.: US 8,652,944 B2
(45) Date of Patent: Feb. 18, 2014

(54) METHOD FOR MAKING SIDE GROWTH SEMICONDUCTOR NANOWIRES AND TRANSISTORS OBTAINED BY SAID METHOD

(75) Inventors: Pere Roca I Cabarrocas, Villebon sur Yvette (FR); Linwei Yu, Palaiseau (FR)

(73) Assignees: Ecole Polytechnique, Palaiseau (FR); Centre National de la Recherche Scientifique, Paris (FR)

( * ) Notice: Subject to any disclaimer, the term of this patent is extended or adjusted under 35 U.S.C. 154(b) by 142 days.

(21) Appl. No.: 13/123,275

(22) PCT Filed: Oct. 9, 2009

(86) PCT No.: PCT/FR2009/051932
§ 371 (c)(1),
(2), (4) Date: Apr. 8, 2011

(87) PCT Pub. No.: WO2010/040967
PCT Pub. Date: Apr. 15, 2010

(65) Prior Publication Data
US 2011/0193053 A1  Aug. 11, 2011

(30) Foreign Application Priority Data
Oct. 9, 2008  (FR) ..................................... 08 56832

(51) Int. Cl.
*H01L 21/20* (2006.01)
*H01L 21/36* (2006.01)
(52) U.S. Cl.
USPC ........... 438/478; 438/485; 977/779; 977/811; 977/938

(58) Field of Classification Search
USPC ......... 257/9, E29.245, E21.09; 438/479, 485; 977/762, 720–722, 779, 784, 811, 900, 977/936–938
See application file for complete search history.

(56) References Cited

U.S. PATENT DOCUMENTS 6,445,006 B1 * 9/2002 Brandes et al. ................. 257/76
6,628,053 B1 * 9/2003 Den et al. ...................... 313/310
(Continued)

FOREIGN PATENT DOCUMENTS

FR  2 860 780 A1  4/2005
FR  2 888 041 A1  1/2007

OTHER PUBLICATIONS

Alet et al. "In situ generation of indium catalysts to grow crystalline silicon nanowires at low temperature on ITO" Journal of Materials Chemistry 2008 Royal Society of Chemistry; Thomas Graham House Science Park GB, vol. 18, No. 43, Oct. 7, 2008, pp. 5187-5189.*

(Continued)

*Primary Examiner* — Cheung Lee
*Assistant Examiner* — Jeremy Joy
(74) *Attorney, Agent, or Firm* — Young & Thompson (57) ABSTRACT

Fabricating semiconductor nanowires (5) on a substrate (1) having a metallic oxide layer (2), includes: a) exposing the metallic oxide layer to a hydrogen plasma (11) of power P for a duration t suitable for reducing the layer and for forming metallic nanodrops (3) of radius ($R_m$) on the surface of the metallic oxide layer; b) low temperature plasma-assisted deposition of a thin layer (4) of a semiconductor material on the metallic oxide layer including the metallic nanodrops, the thin layer having a thickness ($H_a$) suitable for covering the metallic nanodrops; and c) thermal annealing at a temperature T sufficient to activate lateral growth of nanowires by catalysis of the material deposited as a thin layer from the metallic nanodrops. Nanowires are obtained by this method and nanometric transistors including a semiconductor nanowire.

19 Claims, 8 Drawing Sheets

(56) References Cited

U.S. PATENT DOCUMENTS

| | | | |
|---|---|---|---|
| 6,764,874 B1* | 7/2004 | Zhang et al. | 438/99 |
| 7,560,136 B2* | 7/2009 | Ward et al. | 427/122 |
| 2004/0005258 A1* | 1/2004 | Fonash et al. | 422/271 |
| 2006/0024227 A1* | 2/2006 | Maruyama et al. | 423/447.3 |
| 2006/0292870 A1* | 12/2006 | Pribat | 438/680 |
| 2007/0017439 A1* | 1/2007 | Xianyu et al. | 117/108 |
| 2007/0209576 A1* | 9/2007 | Sunkara et al. | 117/87 |
| 2007/0262344 A1* | 11/2007 | Anwar et al. | 257/157 |
| 2008/0311712 A1* | 12/2008 | Anwar et al. | 438/197 |
| 2009/0057653 A1* | 3/2009 | Lee et al. | 257/37 |
| 2010/0203686 A1 | 8/2010 | Pribat et al. | |
| 2011/0121434 A1* | 5/2011 | Li et al. | 257/627 |

OTHER PUBLICATIONS

Alet et al. ("In situ generation of indium catalysts to grow crystalline silicon nanowires at low temperature on ITO" Journal of Materials Chemistry 2008 Royal Society of Chemistry; Thomas Graham House Science Park GB, vol. 18, No. 43, Oct. 7, 2008, pp. 5187-5189).*

Schmidt V. et al.: "Realization of a silicon nanowire vertical surround-gate field-effect transistor", Small Jan. 2006 Wiley-VCH Verlag DE, vol. 2 No. 1 Jan. 2006, pp. 85-88.

Alet P. et al.: "In situ generation of indium catalysts to grow crystalline silicon nanowires at low temperature on ITO", Journal of Materials Chemistry 2008 Royal Society of Chemistry; Thomas Graham House Science Park GB, vol. 18, No. 43, Oct. 7, 2008, pp. 5187-5189, Retrieved from the Internet: URL:http://www.rsc.org/publishing/journals/JM/article.asp?doi=b813046a> [retrieved on Oct. 7, 2008].

Min Z. et al.: "Silicon nanowires by aluminum-induced crystallization of amorphous silicon", Electrochemical and Solid-State Letters Electrochem. Soc USA, vol. 9 No. 2, Feb. 2006, pp. G31-G33, ISSN: 1099-0062, pp. G31, col. 1, line 36-p. G32, col. 2, line 4: figure 1.

Lin H. et al.: Selective growth of vertically aligned carbon nanotubes on nickel oxide nanostructures created by atomic force microscope nano-oxidation, Chemical Physics Letters, North-Holland, Amsterdam, vol. 399, No. 4-6, Dec. 1, 2004, pp. 422-425, ISSN: 0009-2614, p. 422, col. 2, line 14-p. 424, col. 1, line 9; figures 1-4.

International Search Report, dated Dec. 22, 2009, from corresponding PCT application.

* cited by examiner

METHOD FOR MAKING SIDE GROWTH SEMICONDUCTOR NANOWIRES AND TRANSISTORS OBTAINED BY SAID METHOD

BACKGROUND OF THE INVENTION

1. Field of the Invention

The present invention relates to a method of fabricating nanowires, to a method of fabricating an electronic device based on semiconductor nanowires obtained by the method, and to a transistor based on semiconductor nanowires likewise obtained by the method.

2. Description of the Related Art

More particularly, the invention relates to a method of fabricating silicon nanowires by plasma enhanced chemical vapor deposition (PECVD) and by thermal annealing, i.e. a method that is "dry", as opposed to methods that use a liquid. The method of the invention makes it possible to fabricate nanowires in which morphological properties such as shape (straight or rolled up), size, and/or length are under control.

The invention also relates to the use of such silicon nanowires in micro- and nano-electronic applications, e.g. for making transistors and connectors.

It has been known for a few years how to fabricate ordered structures of very small sizes such as carbon nanotubes, silicon nanowires, and silicon nanosticks.

For example, document FR 2 860 780 (D. Pribat et al.) describes a method of fabricating carbon nanowires from a nanoporous matrix in which a metal catalyst is deposited. The carbon nanowires grow epitaxially perpendicularly to the surface of the crystalline substrate.

Document FR 2 888 041 (D. Pribat et al.) also describes fabricating silicon nanowires or nanosticks using a vapor-liquid-solid (VLS) method. In that method, hollow pores are etched in an aluminum substrate, a metallic catalyst is deposited at the bottom of the pores, and then silicon nanowires are grown, which nanowires may be selectively doped during growth so as to generate conductor wires or electronic junctions of the negative intrinsic negative (NIN) or positive intrinsic positive (PIP) type. Once more, the nanowires likewise grow perpendicularly to the surface of the substrate. Solutions for using such nanowires consist in making the nanowires grow transversely to a surface and then in transferring them to another substrate so as to position them, e.g. between two electrical contacts formed on the surface of the sample.

Nanotubes and nanowires present electrical characteristics that are particularly advantageous, given that their conductivity may be several orders of magnitude greater than the conductivity of structures of micrometer or sub-micrometer size.

The nanowires obtained with the techniques described in those prior documents grow perpendicularly to the surface on which the catalyst is deposited. In order to obtain wires parallel to the surface of the substrate it is therefore necessary to form pores parallel to said surface and to deposit the catalyst at the bottom of the pores (cf. FR 2 888 041).

Nevertheless, VLS methods are complicated since they require a plurality of steps and a plurality of different techniques. A method generally takes place by implementing the following steps: 1) cleaning the substrate; 2) depositing catalyst, e.g. by evaporation; 3) annealing the evaporated layer in an oven in order to form droplets; 4) transferring the substrate with the catalysts to a chemical vapor deposition (CVD) chamber; and 5) growing nanowires by exposing the catalyst to a gas, e.g. silane, at a temperature higher than the melting temperature of the drops of catalyst. Some of those steps require high temperatures (T>600° C.). In addition, all of those operations and the sample transfers between the various steps must be performed in a clean room in order to avoid contamination by dust of micrometer or nanometer size. Furthermore, the catalyst is at least partially oxidized on being exposed to air.

Those VLS methods are generally lengthy and expensive and may give rise to problems of reproducibility, given the large number of steps and techniques involved. In addition, those methods lead to growth that is vertical (transverse to the surface of the substrate), which is not very favourable to the use of nanowires for forming electrical connections. The only example of horizontal growth of nanowires that is described in the D. Pribat patents is based on the use of specific porous matrices of $Al_2O_3$.

Furthermore, methods of depositing and etching thin layers are known that involve plasma enhanced chemical vapor deposition (PECVD) for use in fabricating microelectronic components, flat screens, and solar cells.

Plasma methods have the advantage of being performed in vacuum chamber at controlled temperature and pressure, of being rapid, and of enabling very good uniformity to be obtained over very large areas. It is also possible to control the crystallographic structure of the deposited layers as a function of conditions concerning the composition of the gases making up the plasma, pressure, and temperature, . . . . It is thus known how to deposit layers of silicon in the amorphous, polycrystalline, microcrystalline, or nanocrystalline, . . . state. These layers may subsequently be etched selectively using known photolithographic methods of masking and exposure for fabricating sub-micrometric structures. Nevertheless, photolithography is limited by the optical limit of diffraction, and it is difficult to fabricate structures set by nanometric dimensions using those techniques.

SUMMARY OF THE INVENTION

An object of the invention is to remedy those drawbacks, and more particularly the invention provides a method of fabricating semiconductor nanowires on a substrate including a metallic oxide layer.

According to the invention, the method comprises the following steps:

a) exposing the metallic oxide layer to a hydrogen plasma of power P for a duration t suitable for reducing the metallic oxide layer and for forming metallic nanodrops of radius ($R_m$) on the surface of the metallic oxide layer;

b) low temperature plasma-assisted deposition of a thin layer of a semiconductor material on the metallic oxide layer including the metallic nanodrops, said layer having a thickness ($H_a$) suitable for covering the metallic nanodrops; and c) thermal annealing under vacuum at a temperature T higher than or equal to the melting temperature of the metallic nanodrops (3) so as to activate lateral growth of semiconductor nanowires by catalysis of the semiconductor material deposited as a thin layer from the metallic nanodrops.

In an implementation of the invention, the semiconductor material deposited as a thin layer is selected from silicon (Si), germanium (Ge), carbon (C), or an alloy of these materials (SiGe, SiC, or SiGeC), said semiconductor material being deposited in amorphous, micro- or poly-crystalline form.

In a preferred implementation, the invention provides a method of fabricating silicon nanowires and the material of the deposited layer is hydrogenated amorphous silicon (a-Si:H) having a thickness ($H_a$).

In another implementation of the invention, the invention provides a method of fabricating carbon nanowires and the material of the deposited layer is hydrogenated amorphous carbon (a-C:H) having a thickness ($H_a$).

In a preferred implementation of the nanowire fabrication method of the invention, the metallic oxide is an oxide of indium (InO), of tin ($SnO_2$), of zinc (ZnO), of indium tin alloy (ITO), or a multilayer system of ZnO/ITO or $ZnO/SnO_2$.

In a particular implementation of the invention, the radius ($R_m$) of the metallic nanodrops is known and the duration of deposition of the semiconductor layer is determined in such a manner as to obtain a predetermined ratio $\eta$ between the thickness ($H_a$) of the deposited layer and the radius ($R_m$), the ratio $\eta$ being suitable for ensuring lateral growth of the nanowires.

In a preferred implementation of the invention, the ratio $\eta$ is equal to 1 so that the morphology of the nanowires is rectilinear over a length lying in the range of ten times the diameter of the nanowire to more than 100 times the diameter of the nanowire.

In a preferred implementation, the nanowire fabrication method of the invention comprises a step of locally masking the metallic oxide layer so as to form electrodes, and the growth of a nanowire is performed between two electrodes.

In a particular implementation of the invention, the nanowire fabrication method comprises a step of forming guide means during the thermal annealing step c), the lateral growth of the semiconductor nanowires being guided along said guide means along a predefined path.

In a preferred implementation, the step of forming guide means consists in forming a channel of semiconductor material, said channel forming said guide means.

In a preferred implementation, the diameter of the channel of semiconductor material is substantially equal to the diameter of the metallic nanodrop.

In a preferred implementation, the step of forming guide means consists in forming a step on the substrate, said step having a lateral wall and forming said guide means.

In a preferred implementation, the nanowire fabrication method comprises, between step a) and step b), a step of depositing a layer of dielectric material, followed by a step of etching said layer of dielectric material to form said step in said layer of dielectric material.

In a preferred implementation, the method of fabricating nanowires includes, between step b) and step c), an operation b') of forming borders on the thin layer of semiconductor material, said operation b') being performed by ion etching, and each border extends over the thin layer of semiconductor material so as to form said guide means.

The method of the invention makes it possible to control the direction and the shape of the nanowires and to make the nanowires grow directly on the substrate from one electrode to the other, for example. It is possible to obtain a nanowire of any desired shape, including nanowires that are perfectly straight.

The invention makes it possible to grow semiconductor nanowires not only on a plane surface, but also on the surface of any three-dimensional article, thus making it possible to design and fabricate functional three-dimensional networks of crystalline silicon nanowires. This leads to applications in 3D integrated circuits and in nano-electro-mechanical systems.

The invention also provides a method of fabricating an electronic device having a substrate.

According to the invention, the method comprises the following steps:

d) forming a layer of metallic oxide on said substrate so as to define a region for initiating growth of semiconductor nanowires;

e) forming one or more guide means for the growth of semiconductor nanowires, each guide means connecting the semiconductor nanowire growth initiation region to a region for ending semiconductor nanowire growth so as to define a functional path; and f) fabricating one or more semiconductor nanowires in application of steps a), b), and c) so as to implement guided growth of semiconductor nanowires along respective guide means during step c), each semiconductor nanowire initiating its growth in the semiconductor nanowire growth initiation region and continuing its growth to the semiconductor nanowire growth end region.

In a particular implementation, during step e), between steps a) and b), a step is performed of depositing a layer of dielectric material on the substrate and a layer of metallic oxide, this step of depositing a dielectric material layer being followed by a step of etching said dielectric material to form a step in said dielectric material layer, said step forming the guide means for the growth of semiconductor nanowires.

The invention also provides an electrical transistor based on one or more semiconductor nanowires obtained by the method of the invention, one of the nanowires being suitable for forming a semiconductive connection between a source, a drain, and a gate of said transistor, control being performed via the gate that is separated from the nanowire by a dielectric layer.

In a particular embodiment, the transistor comprises a three-dimensional network of nanowires.

Advantageously, the reducing plasma and the depositing plasma are radiofrequency (RF) type low-temperature plasmas.

The present invention also relates to the characteristics that appear from the following description and that should be taken in isolation or in any technically feasible combination.

BRIEF DESCRIPTION OF THE DRAWING FIGURES

The description is given by way of non-limiting example and serves to provide a better understanding of how the invention can be implemented, with reference to the accompanying drawings, in which.

DETAILED DESCRIPTION OF THE INVENTION

Figure 1:
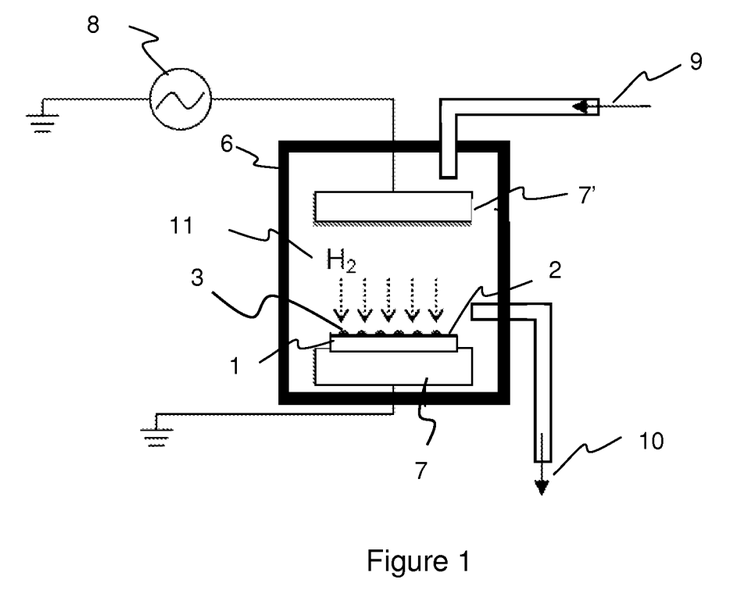
FIG. 1 shows a first step a) of the nanowire fabrication method of the invention.

FIG. 1 is a diagram of a PECVD reactor in which the various steps of preparing semiconductor nanowires in accordance with the invention are performed.

The reactor comprises a vacuum chamber 6, a sample holder 7 electrically connected to ground, and an RF generator 8 connected to an RF electrode 7' by means of an impedance-matching circuit (not shown in the figure). The vacuum chamber 6 is connected to pump means 10 in order to establish vacuum in the chamber, and to gas injector means 9 in order to form a plasma.

The substrate 1 comprises a thin layer 2 of conductive oxide (or metallic oxide) deposited on a support plate. In photovoltaic applications, the thin layer 2 is preferably a transparent conductive oxide (TCO). Under such circumstances, the transparent conductive oxide is preferably indium oxide ($In_2O_3$), tin oxide ($SnO_2$), a combination of indium and tin oxide (ITO), a zinc oxide (ZnO), or indeed a combination of these various metallic oxides. By way of example, the support is a plate of glass, or of crystalline silicon, suitable for withstanding the temperatures of the thermal annealing step. In an implementation, the thickness of the layer 2 of metallic oxide ($SnO_2$) is of the order of 100 nanometers (nm). The substrate 1 is placed on the sample holder 7 of an RF type plasma deposition reactor (operating at 13.56 megahertz (MHz)). The sample holder 7 constitutes one of the electrodes of the plasma chamber 6. An RF electrode 7' is situated above the sample holder 7. After establishing vacuum inside the plasma chamber 6, gaseous hydrogen ($H_2$) is introduced in order to form a hydrogen plasma 11. The hydrogen plasma 11 causes the TCO to be reduced, thereby forming metal droplets 3 on the surface of the metallic oxide layer.

The radius ($R_m$) of the metal droplets 3 obtained by reducing the surface of the TCO layer 2 depends on the density or the power of the plasma 11, on the duration of exposure, and on temperature. This radius $R_m$ may be calibrated as a function of the various parameters of the reactor, and in particular as a function of the duration of the reduction plasma.

In an implementation, hydrogen ($H_2$) plasma treatment is performed on a substrate 1 that includes a layer 2 of ITO. This produces droplets 3 of indium on the surface of the ITO layer. By way of example, experimental conditions may be as follows: pressure of hydrogen ($H_2$) 1000 millitorr (mTorr), power of the plasma 2 watts (W) ($\approx$25 milliwatts per square centimeter ($W/cm^2$)), the temperature of the substrate $T_{sub}$=300° C., the temperature of the RF electrode $T_{RF}$=200° C., and the duration of the exposure to treatment is 1 minute (min).

The metallic indium droplets 3 obtained in this way present a diameter of about 30 nm on the surface of the ITO layer.

Figure 2:
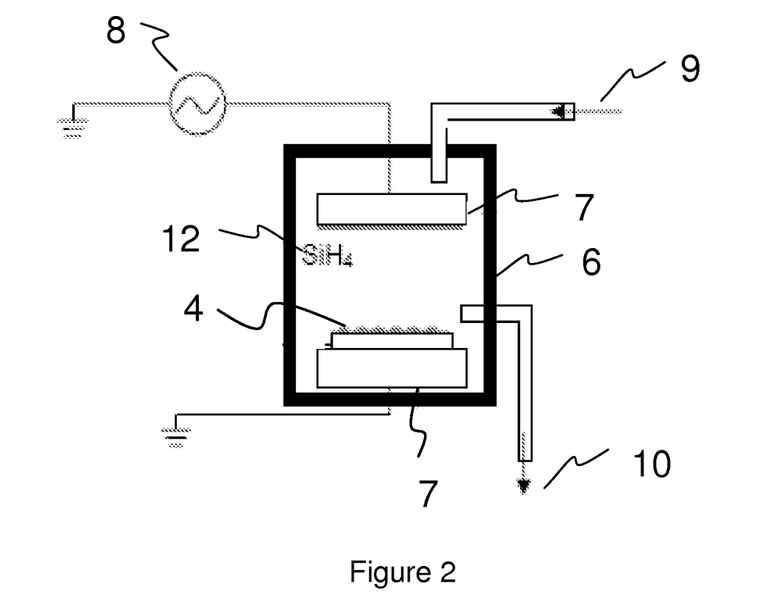
FIG. 2 shows a second step b) of the nanowire fabrication method of the invention.

FIG. 2 corresponds to the second step b) of the nanowire preparation method.

The substrate 1 on which the catalyst metal droplets 3 are formed is maintained under vacuum in the plasma chamber 6. The catalyst is thus not exposed to air. A new carrier gas is then introduced, namely silane ($SiH_4$). Thereafter a silane plasma 12 is applied that serves to deposit a thin layer 4 of hydrogenated amorphous silicon (a-Si:H) on the substrate that has been subjected to reduction, i.e. over the metallic oxide layer 2 and the metallic droplets 3. The silane plasma 12 is interrupted when the thickness $H_a$ of the deposited layer 4 is sufficient to cover the metallic droplets 3. The deposition rate of the layer of material may be calibrated for a reactor so as to enable the thickness $H_a$ to be controlled as a function of the duration of deposition. In this implementation, the thickness of the amorphous silicon layer 4 lies in the range of 0.05 micrometers ($\mu m$) to 1 $\mu m$. By way of example, the experimental conditions may be as follows: pressure of silane ($SiH_4$) 120 mTorr, plasma power 2 W ($\approx$60 $mW/cm^2$), substrate temperature $T_{sub}$=100° C., RF electrode temperature $T_{RF}$=100° C., and deposition duration 5 min.

Figure 3:
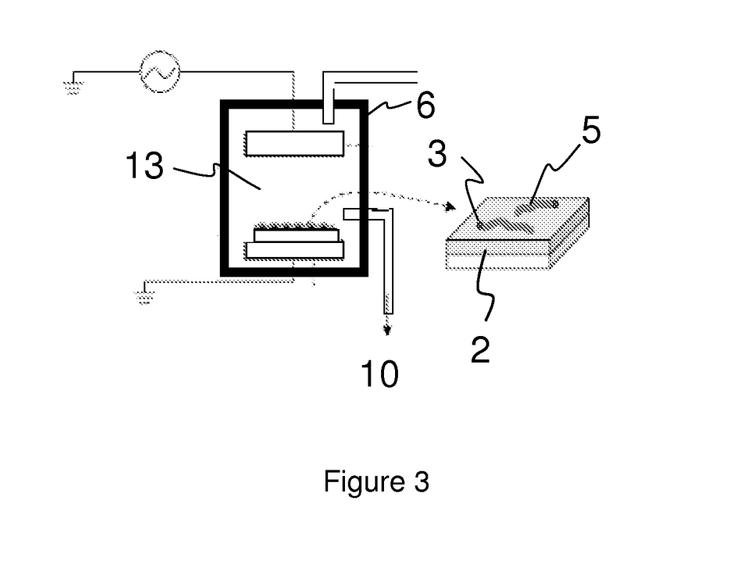
FIG. 3 shows a third step c) of the nanowire fabrication method of the invention.

FIG. 3 corresponds to the third step c) of the nanowire preparation method.

The third step is a step of thermal annealing in vacuum.

The substrate including the catalyst metal droplets 3 covered by a layer 4 of a-Si:H is maintained under vacuum in the reactor 6. The sample is then annealed under vacuum (residual pressure$\approx 10^{-6}$ millibar (mbar)), the substrate temperature being maintained at $T_{sub}$=500° C. and the RF electrode temperature at $T_{RF}$=400° C. for a duration of 2 hours (h) in order to allow lateral growth of silicon nanowires (SiNW) 5. The lateral growth of silicon nanowires 5 on the surface of the substrate takes place during this step.

The thermal annealing temperature is higher than or equal to the melting temperature of the metallic nanodrops. The minimum temperature depends firstly on the metallic material used and its melting temperature, however this melting temperature may also depend on the size of the metallic droplets. The minimum temperature also depends on the solubility of the semiconductor material in the catalyst.

In practice, the annealing temperature may be lower than 300° C., or indeed lower than 250° C. for indium. The temperature may be even lower for other materials (e.g. gallium).

The catalyst metal droplets 3 consume the amorphous silicon 4 present on the surface, the silicon thus being dissolved by the catalyst and then precipitated in crystalline form, thereby forming silicon nanowires 5.

Figure 4:
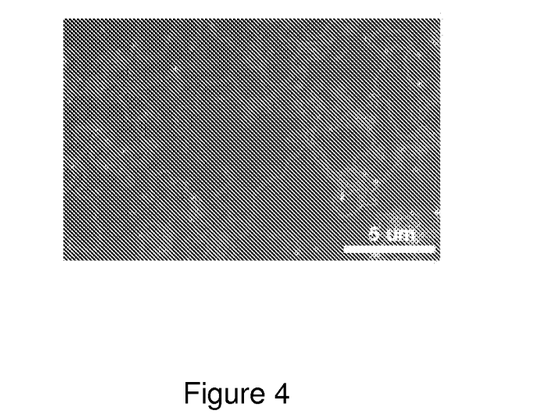
FIG. 4 is a photograph obtained with a scanning electron microscope (SEM) of nanowires obtained in an implementation of the invention.

FIG. 4 is an SEM photograph of nanowires 5 obtained using the above-specified steps of the method. Nanowires 5 can be seen having a diameter of about 50 nm, with some of them having a length of several tens of micrometers.

Nevertheless, the distribution of these nanowires on the surface is irregular, and the nanowires 5 present numerous bends over lengths of more than 5 μm.

However, it has been found that the morphology and the curvature of silicon nanowires 5 may be adjusted by controlling the ratio between firstly the thickness ($H_a$) of the covering of the hydrogenated amorphous silicon layer 4 and secondly the radius ($R_m$) of the metallic droplets 3.

In a preferred implementation of the invention, an equilibrium is obtained when the following condition is satisfied:

$$2 \cdot R_m \cdot H_a \cdot \alpha \cdot v_{ma} = S_{SiNW} \cdot v_{cm}$$

where:

$v_{cm}$ and $v_{ma}$ are the travel speeds respectively of the crystal-metal interface and of the metal-amorphous interface;

$S_{SiNW}$ represents the effective cross-section area of the SiNWs 5;

$R_m$ is the radius of the metallic droplets (e.g. of indium);

$H_a$ is the covering thickness of the layer 4 of a-Si:H; and $\alpha$ is the volume shrinkage during the transformation of the amorphous phase silicon to the crystalline phase.

It is assumed that the diameter of a SiNW 5 is proportional to the diameter of a drop 3 of indium:

$$S_{SiNW} = f \cdot S_m = f \cdot \pi \cdot R_m^2$$

where f is a geometrical factor.

This produces a simplified relationship between the travel speeds of the two interfaces:

$$\eta = v_{cm}/v_{ma} \approx A \cdot H_a/R_m$$

where:

$$A = 2 \cdot \alpha / \pi \cdot f$$

The ratio between the covering thickness ($H_a$) of the layer of a-Si:H and the radius ($R_m$) of the metallic nanodrops 3 is a key parameter for controlling the equilibrium of the growth of silicon nanowires 5, thereby influencing the shape, the curvature, and the surface roughness of the silicon nanowires 5.

Under equilibrium conditions, $\eta \approx 1$, the travel speed of the two interfaces is substantially the same ($v_{cm} \approx v_{ma}$), and it is possible to obtain a rectilinear silicon nanowire 5.

In contrast, away from equilibrium, i.e. $\eta \neq 1$, the metallic drops 3 are deformed and as a result the SiNW 5 is curved.

Figure 5:
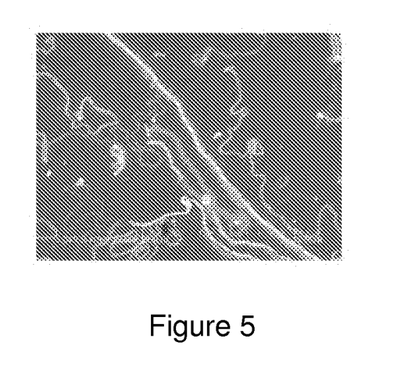
FIG. 5 is a photograph obtained by a scanning electron microscope (SEM) of quasi-rectilinear nanowires obtained in another implementation of the invention.
Figure 6:
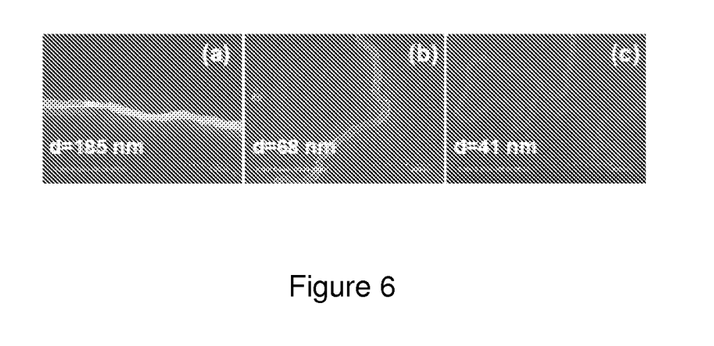
FIGS. 6a to 6c are SEM pictures of nanowires of various morphologies and diameters obtained using various implementations of the method of the invention.

In the examples of FIGS. 5 and 6, silicon nanowires 5 of different diameters and morphologies are obtained using the same deposition conditions.

In FIG. 6a, an electron microscope was used to measure a nanowire 5a having a diameter of 185 nm, which wire was practically rectilinear over the length of the picture, i.e. about 4 μm. In FIG. 6b, the microscope was used to measure a nanowire 5b having a diameter of 68 nm and a plurality of bends, with straight sections presenting a length of less than 1 μm. In FIG. 6c, a microscope was used to measure a nanowire 5c having a diameter of 41 nm, with numerous bends.

Since $R_m \approx f \cdot d$, the equilibrium condition and thus the morphology of curvature for FIGS. 6a to 6c are different. Since the thickness ($H_a$) of the layer of a-Si:H is constant, only nanowires 5 having a matching diameter can develop in balanced manner following a straight line, as in FIG. 6a, in which the condition $\eta \approx 1$ appears to be satisfied. In contrast, nanowires of smaller diameters appear to be bent in FIG. 5.

The experimental conditions for obtaining the nanowires 5 of FIGS. 5-6 on a flat sample of ITO were as follows:

|  | Step 1 | Step 2 | Step 3 |
|---|---|---|---|
| RF power | 5 W | 2 W | 0 |
| Duration | 1 min | 5 min | 50 min |
| Pressure | 600 mTorr | 120 mTorr | vacuum |
| Gas flow rate | 100 sccm $H_2$ | 10 sccm $SiH_4$ | 0 |
| RF electrode temperature | 200° C. | 100° C. | 200° C. |
| Substrate temperature | 300° | 100° C. | 500° C. |

The silicon nanowires 5 grow from surface sites of the ITO layer having indium drops formed after the first step of hydrogen plasma treatment. Thereafter, the nanowires grow laterally by consuming the matrix of the a-Si:H layer.

It is thus possible for nanowires 5 to form on either side of a gap formed between two predefined ITO electrodes, thereby connecting the electrodes together so as to form an electrical connection. Thereafter, it is possible to make electrical networks of assembled SiNWs.

Figure 7:
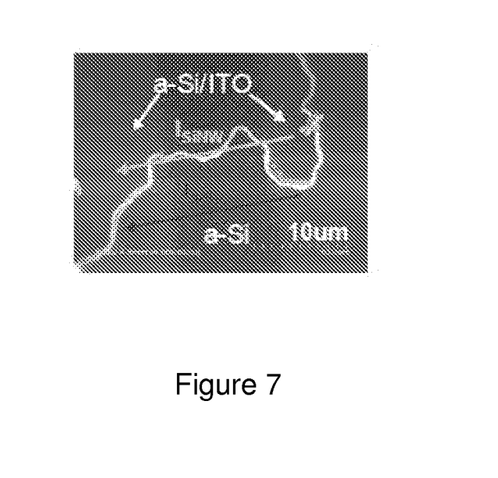
FIG. 7 is an SEM photograph of an electronic structure including a silicon nanowire between two conductor tracks.

FIG. 7 shows an example of a silicon nanowire 5 forming a connection between two ITO electrodes 14 and 15 that are spaced apart by 10 μm. The two pale zones at the sides are the ITO electrodes covered by a-Si:H, and the dark zone in the center comprises solely a layer of a-Si:H. A single SiNW crosses the gap, electrically connecting together the two ITO electrodes.

By applying an electric field between the ITO electrodes, two current components pass through connection: the current that flows via the nanowire and the current that passes via the layer of a-Si:H that covers the entire structure.

Figure 8:
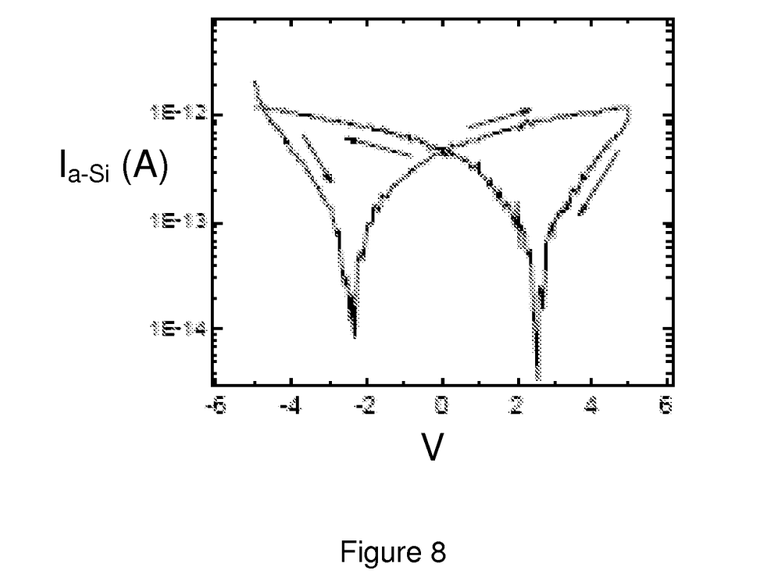
FIG. 8 is a current-voltage curve for an electronic connection comprising a layer of amorphous silicon between two ITO electrodes.
Figure 9:
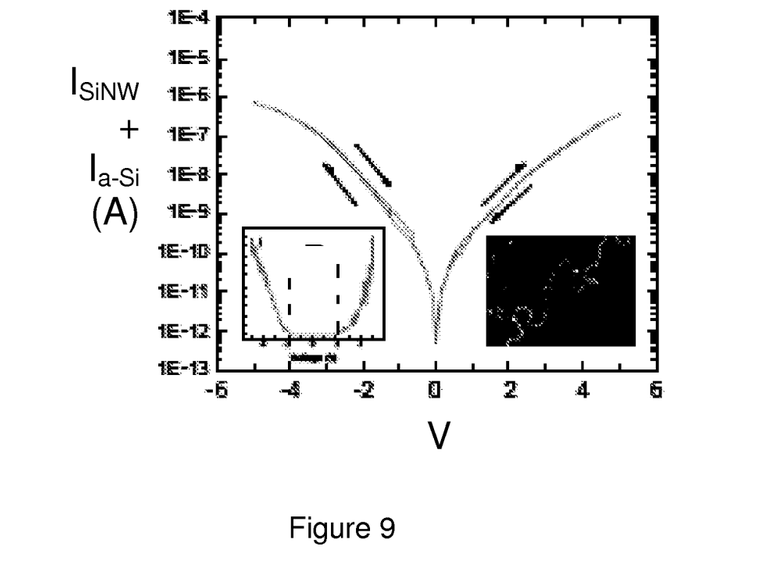
FIG. 9 is a current-voltage curve for an electronic connection comprising a nanowire between two ITO electrodes, together with the conductance of the connection shown in an insert.

FIGS. 8 and 9 show the current-voltage characteristics obtained with two pairs of ITO electrodes, respectively without a nanowire (FIG. 8) and with a nanowire (FIG. 9). Voltage scanning is represented by arrows. The image of the nanowire of the connection associated with the curve is also incorporated in FIG. 9, together with a measurement of its conductivity.

It can be seen that the current density $I_{SiNW}$ is greater than the current density in the layer of hydrogenated amorphous silicon ($I_{a\text{-}Si}$) by about six orders of magnitude. The transport characteristics between the ITO electrode connection via a nanowire are dominated very greatly by the crystalline SiNW nanowire that is much more highly conductive than the layer of amorphous silicon.

This result is most encouraging for developing various applications for such nanowires.

By forming a predefined pattern of electrical and/or electronic contacts on the substrate, it is thus possible to produce nanoelectric components based on silicon nanowires (SiNWs).

Figure 10:
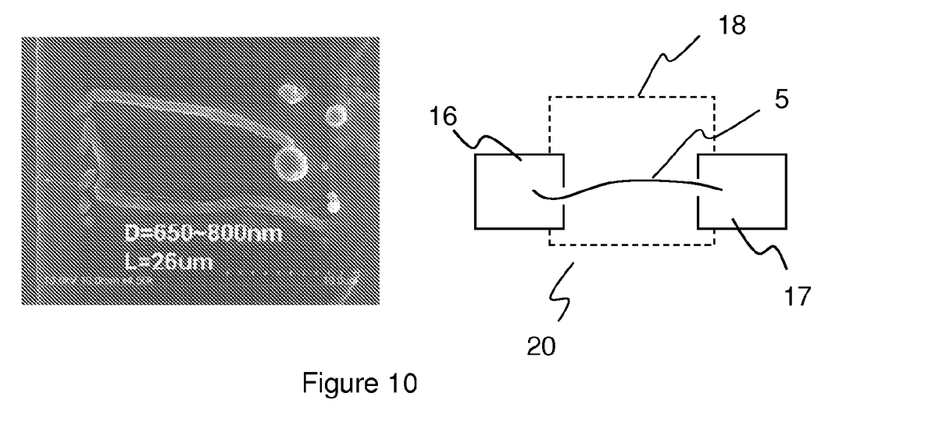
FIG. 10 is an SEM photograph of a thin-layer nanometric transistor including a semiconductor connection based on a nanowire between the drain and the source of the transistor (which is shown in diagrammatic plan view on the right)

FIG. 10 shows an example application for fabricating a nanometric electronic transistor in which the semiconductive connection is formed by a nanowire obtained by the method of the invention, the nanowire having one of its ends joined to the source 16 of the transistor and its other end joined to the drain 17 of the transistor. In the SEM photograph of FIG. 10, there can be seen two nanowires, only one of which (nearer the bottom of the photograph) constitutes an active junction between the source (to the left in the photograph) and the drain (to the right in the photograph). The nanowire towards the top of the photograph is not active.

Figure 11:
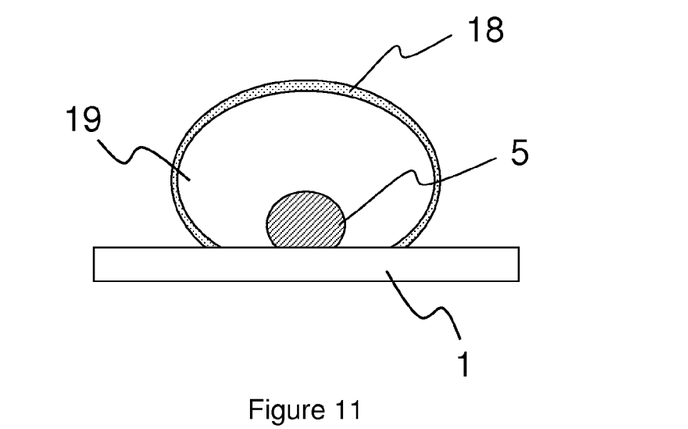
FIG. 11 is a diagram in section view of a nanowire forming a semiconductor connection in a transistor, the semiconductor nanowire being surrounded by a layer of $SiN_x$ and a layer of aluminum forming the gate of the transistor.

FIG. 11 is a section view of the FIG. 10 transistor 20 showing a cross-section of the nanowire 5. The silicon nanowire 5 has a diameter of 80 nm. The nanowire 5 is covered by a first layer of $SiN_x$ presenting a thickness of 300 nm, followed by a layer of aluminum presenting a thickness of 200 nm. By applying a voltage to the aluminum layer, operation of the transistor 20 is activated. The aluminum layer thus constitutes the gate of the transistor.

Figure 12:
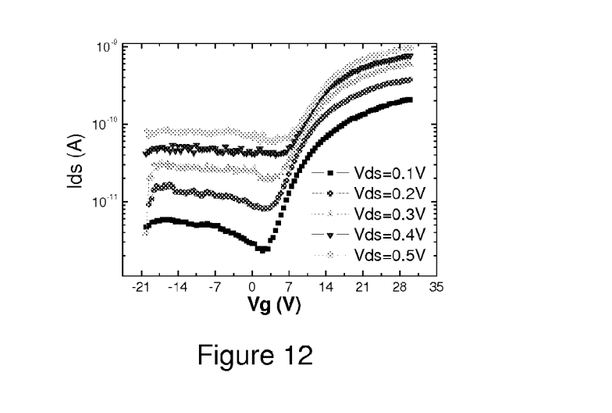
FIG. 12 shows current-voltage curves for a transistor based on a semiconductor nanowire, for different drain-source voltages.

FIG. 12 shows the current-voltage curves for such a transistor, for different voltages $V_{ds}$ applied between the drain and the source of the transistor, and for different gate voltages. It can be seen that the current-voltage curves are characteristic of an electronic transistor.

The method of the invention serves to guide the growth of nanowires: this growth takes place horizontally in the plane of the substrate and not perpendicularly to the surface of the substrate as in VLS type methods.

Controlling the steps of reducing the metallic oxide to form metallic nanodrops on the surface of the substrate and of depositing a layer of amorphous material serves to adjust the parameters so as to obtain nanowires that, after thermal annealing, present a diameter of a few tens of nanometers and that present morphology that is rectilinear over a length of several micrometers.

The crystalline nature of the nanowires confers remarkable properties thereto. The crystalline nanowires are advantageously conductive or semiconductive. In particular, the silicon nanowires have electrical conductivity properties that are improved by several orders of magnitude compared with the layers of amorphous silicon from which they are formed. The nanowires may be doped, thus making it possible to fabricate PN, NP, PIN, . . . junctions on which electronic transistors are based.

The controlled and oriented fabrication of semiconductor nanowires between two electrodes makes it possible to fabricate nanoelectronic components. FIGS. 10 to 12 show how a transistor can be fabricated using such a nanowire as a semiconductive connection.

The three steps of the semiconductor nanowire fabrication method (forming metallic droplets, depositing the semiconductor material, and thermal annealing) can be performed in a single vacuum deposition reactor.

The method of the invention makes use of low temperature RF plasma deposition/etching methods followed by a step of thermal annealing in a single reactor. The method enables nanowires to be fabricated on a size scale that is much smaller than a micrometer, with the diameter of the nanowires being a few tens of nanometers. The method of the invention does not require submicronic photolithography nor does it require nanometric alignment, and it can be industrialized on a large scale and on substrates of very large size.

The method of the invention is a relatively low temperature method. The temperatures used lie in the range of 250° C. to 600° C. It is advantageous to operate in the low temperature portion of this range.

These low temperatures are compatible with glass substrates, which are in widespread use, e.g. in applications such as flat screens and photovoltaic applications.

In an implementation of the invention, the nanowire fabrication method includes a step of guided or controlled lateral growth of semiconductor nanowires 5 along a predefined path, making it possible to control the shape of the nanowires and to grow the nanowires directly on the substrate, e.g. from one electrode to another.

This step of guided lateral growth of semiconductor nanowires 5 is performed during the thermal annealing step c), in which the semiconductor nanowires 5 are guided or oriented laterally along guide means following a path that is predefined in advance.

The step of guided lateral growth of semiconductor nanowires 5 may be performed using three possible methods or alternatives.

In the example of FIGS. 13 to 19, the thin layer 4 of semiconductor material is a layer of hydrogenated amorphous silicon (a-Si:H), the metallic oxide layer 2 is a layer of ITO, and the semiconductor nanowires 5 are crystalline silicon nanowires.

Figure 13:
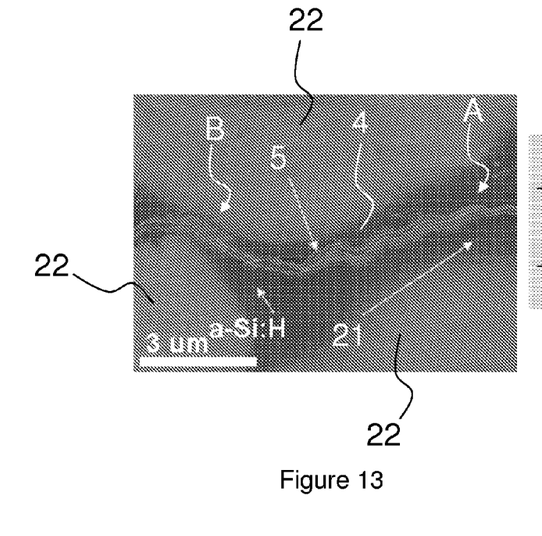
FIG. 13 is an SEM photograph of a nanowire obtained by a first guided lateral growth method.
Figure 14:
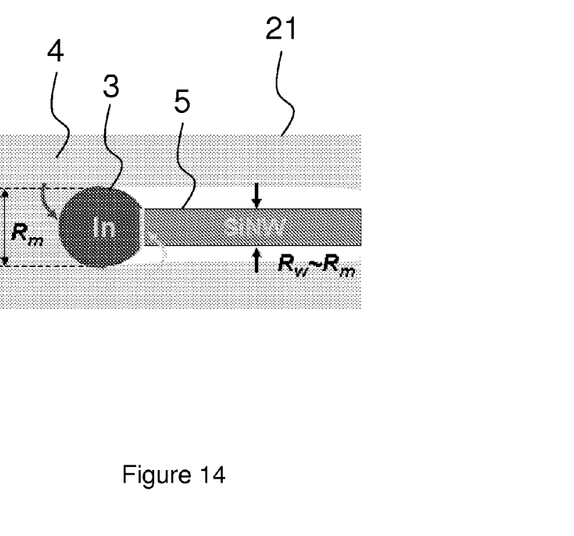
FIG. 14 is a diagram showing the principle on which this first guided lateral growth method is based.

A first possible method, as shown in FIGS. 13 and 14, consists in defining or tracing a channel of semiconductor material 21 to form guide means, which is the sole feed precursor for guiding the growth of the semiconductor nanowire 5. In the example of FIGS. 13 and 14, the channel of transistor material 21 is a channel of hydrogenated amorphous silicon that is obtained by etching.

FIG. 13 is an SEM photograph showing a crystalline silicon nanowire 5 obtained by this first method of guided lateral growth.

FIG. 14 is a diagram showing the principle of this first method of guided lateral growth.

This operation of forming a channel 21 of hydrogenated amorphous silicon is implemented between the plasma-assisted deposition step b) and the thermal annealing step c). It consists in an etching operation.

In FIG. 13, a narrow channel 21 (presenting dark contrast) of hydrogenated amorphous silicon presenting a length of about 12 μm is defined between three empty regions 22 (presenting pale contrast).

A crystalline silicon nanowire 5 grew in this hydrogenated amorphous silicon channel 21 from right to left in the figure, during annealing step c). The crystalline silicon nanowire 5 followed the path imposed by the hydrogenated amorphous silicon. The diameter $R_w$ of the crystalline silicon nanowire 5 is slightly smaller than the diameter $R_m$ of the indium nanodrop 3.

In preferred manner, the diameter of the hydrogenated amorphous silicon channel 21 is substantially equal to the diameter of the indium nanodrop 3 so as to impose an effective constraint on the lateral movement of the crystalline silicon nanowire 5.

The size and the morphology of the crystalline silicon nanowire 5 are influenced by the size of the hydrogenated amorphous silicon channel 21. In region A presenting a larger size of hydrogenated amorphous silicon channel 21, the crystalline silicon nanowire 5 is wide and undulating. In region B, the hydrogenated amorphous silicon channel 21 is narrower, leading to a portion of crystalline silicon nanowire 5 that is narrower and straighter.

Since the hydrogenated amorphous silicon channel 21 becomes narrower going from region A towards region B, the effective size of the channel ($R_{ch}$) becomes smaller than the size of the indium nanodrop 3.

In region B, the crystalline silicon nanowire 5 drags behind the indium nanodrop 3 and pulls against it, causing the wire to be stretched and deformed (reduction in diameter $R_m$).

The method that consists in defining or tracing a hydrogenated amorphous silicon channel 21 provides effective and reproducible control means for controlling not only the direction in which the nanowire 5 grows, but also the morphology and the internal stress state of the nanowire 5.

Figure 15:
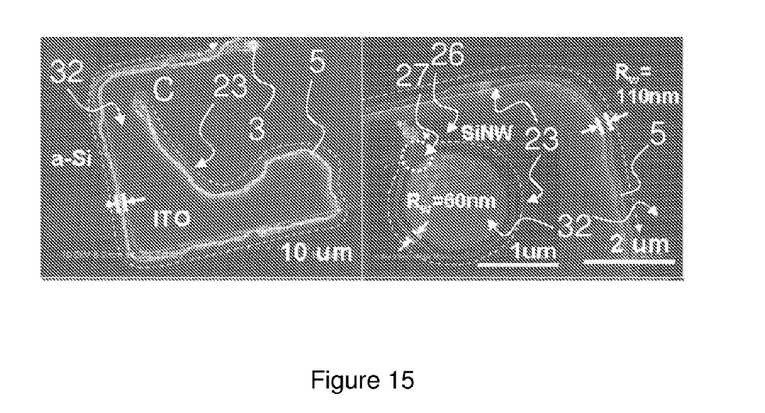
FIG. 15 shows two SEM photographs of nanowires obtained by a second guided lateral growth method.
Figure 16:
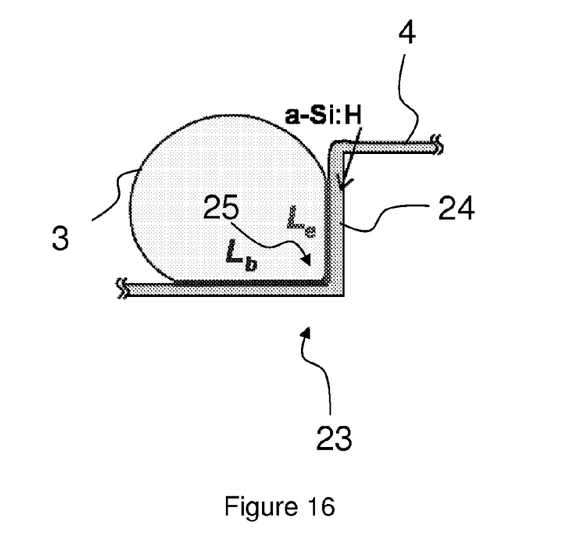
FIG. 16 is a diagram showing the principle on which this second guided lateral growth method is based.

There is also a second possible method of performing guided lateral growth of semiconductor nanowires 5, as shown in FIGS. 15 and 16.

FIG. 15 shows two SEM photographs of crystalline silicon nanowires 5 obtained using this second guided lateral growth method.

FIG. 16 is a diagram showing the principle on which this second guided lateral growth method is based.

The second method comprises an operation of forming a step 23 on the substrate 1. This operation of forming a step 23 on the substrate 1 is performed prior to step a), while depositing the metallic oxide layer 2. This metallic oxide layer deposition step 2 serves to form on the substrate 1 one or more metallic oxide pads or substrates 32, e.g. of ITO 32. The shape of the ITO substrate 32 may be controlled. A step 23 is formed at the periphery of the ITO substrate 32.

Thereafter, the step 23 is covered by the thin layer 4 of semiconductor material during plasma-assisted deposition step b), while conserving its general step shape.

The step 23 has a side wall 24 that is covered by a layer 4 of semiconductor materials such as hydrogenated amorphous silicon, and it extends laterally over the metallic oxide layer 2 following a predefined path, thereby forming guide means. The lateral wall 24 is preferably perpendicular to the surface of the substrate 1. It could equally well be inclined instead of being perpendicular to the surface of the substrate 1. The lateral wall 24 co-operates with the horizontal surface of the substrate 1 to form a corner 25.

This step 23 serves to limit the movement of the indium nanodrop 3 so as to guide it along the predefined growth path.

As shown by the left photograph in FIG. 15, the growth of the crystalline silicon nanowire 5 starts in a free region C that does not have a step 23, and on a modeled ITO substrate 32 (e.g. having a thickness of 100 nm) that presents preformed steps 23.

When the crystalline silicon nanowire 5 reaches the corner 25 of the step 23, it is trapped and it then develops along the lateral wall 24.

When the catalyst is in a corner 25, an additional absorption interface is formed on the vertical lateral wall 24 of the step 23 and traps the indium nanodrop 3 so that it moves along the corner 25 and produces a crystalline silicon nanowire 5 that is well aligned.

More accurate guidance of crystalline silicon nanowires 5 has been performed with smaller indium nanodrops 3 (diameter lying in the range of 60 nm to 110 nm). The crystalline silicon nanowire 5 is tied more closely to the step 23.

For nanodrops 3 that are large enough to take up a position astride the corner 25 of the step 23, i.e. to have two contact points, one with the vertical lateral wall 24 and the other with the horizontal surface of the substrate 1, but without making contact with the corner 23, two substantially parallel crystalline silicon nanowires 5 are formed along the step 23.

A pair of crystalline silicon nanowires 5 with similar diameters is produced using a single nanodrop 3. Tests have been performed with a nanodrop having a diameter of 2 μm.

This pair of crystalline silicon nanowires 5 is obtained from two independent nucleation centers that coexist on the nanodrop 3 but that are separated by the corner 25.

With this second method of guided lateral growth of crystalline silicon nanowires 5, it is possible to obtain nanowire shapes that are more complicated, such as a silicon nano-ring structure 26.

Electrical accessibility to said nano-ring structure 26 is provided by the ends of the ring structure 26, which ends are isolated from each other by a narrow isolated space 27.

Alternatively, the method of fabricating nanowires 5 includes, between step a) and step b), a step of depositing a layer 33 of dielectric material followed by a step of etching the layer 33 of dielectric material in order to form the step 23 in the layer 33 of dielectric material. The dielectric material 33 is preferably silicon nitride.

The layer 33 of dielectric material and the layer 2 of metallic oxide are then covered by a thin layer 4 of semiconductor material during step b).

Figure 17:
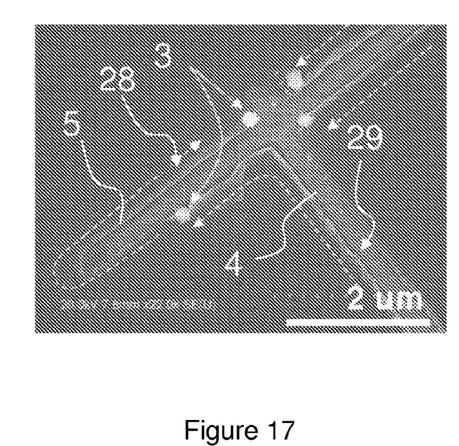
FIG. 17 is an SEM photograph of nanowires obtained by a third guided lateral growth method.
Figure 18:
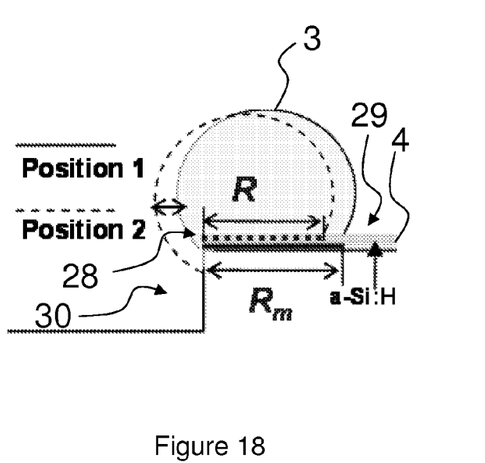
FIG. 18 is a diagram showing the principle on which this third guided lateral growth method is based.

There also exists a third method of guided lateral growth of crystalline silicon nanowires 5, as shown in FIGS. 17 and 18.

FIG. 17 shows an SEM photograph of crystalline silicon nanowires 5 obtained by the third method of guided lateral growth.

FIG. 18 is a diagram showing the principle on which this third method of guided lateral growth is based.

The third method of guided lateral growth of crystalline silicon nanowires 5 comprises, between step b) and depositing a thin layer 4 of a semiconductor material and thermal annealing step c), an operation b') of forming borders or edges 28 on the thin layer 4 of semiconductor material.

In the examples of FIGS. 17 and 18, the thin layer 4 of semiconductor material is a thin layer of hydrogenated amorphous silicon.

In the example of FIG. 17, trenches 29 having a width of 200 nm are etched by means of a focused ion beam (FIB) of Ga$^+$ ions focused on a hydrogenated amorphous silicon layer 4 having a thickness of 120 nm. The hydrogenated amorphous silicon layer 4 was deposited on an ITO/Cg substrate after hydrogen plasma treatment.

These trenches 29 have borders or edges 28 on either side thereof. The trenches 29 are etched along predefined paths and they form means for guiding nanowires 5.

After thermal annealing step c), the metallic nanodrops 3 positioned on the borders of the trenches 29 become active and move along the borders 28 etched in the hydrogenated amorphous silicon, thereby producing crystalline silicon nanowires 5 that are well aligned with the two sides of the etched trenches 29.

The crystalline silicon nanowires 5 obtained with this third method are straighter than those obtained with the first and second methods, implying that $\eta \approx 1$.

This is a result of a unique self-adjustment mechanism that is possible only for crystalline silicon nanowires 5 growing along a border 28 etched in hydrogenated amorphous silicon.

As shown in FIG. 18, when the metallic nanodrop 3 is pushed from behind by the crystalline silicon nanowire 5, it is possible for the metallic nanodrop 3 to adjust itself by tilting towards the empty side 30 (as represented by the transition from the position 1 towards the position 2 in FIG. 18).

In this way, the effective absorption width at the border 28 of the silicon trench 29 can be adjusted (and reduced to $R<R_m$) in order to maintain the growth equilibrium condition of $\eta \approx 1$.

In contrast, when the metallic nanodrop 3 moves away from the border 28, it forms a highly curved crystalline silicon nanowire 5.

For this third method of guided growth, it is preferable for $\eta>1$, so as to force the crystalline silicon nanowire 5 to develop exactly along the border 28, instead of moving away therefrom and becoming curved.

By comparing the three methods of guided growth, it can be seen that it is simpler to define a border than it is to define a silicon channel.

The third method of guided growth is a method that is more profitable and more promising than the first method of guiding the growth of crystalline silicon nanowires 5 along a desired path.

Nevertheless, the first method of guided growth based on forming an amorphous silicon channel is more effective in controlling the stress state within the crystalline silicon nanowire 5, and that can be of great importance in designing and fabricating high performance nanoelectronic devices.

In addition, the first method of growth may be implemented not only on a plane surface, but also on the surface of any three-dimensional article, thus making it possible to design and fabricate functional three-dimensional networks of crystalline silicon nanowires 5. This opens the way to applications in 3D integrated circuits and in nano-electromechanical systems.

The invention also relates to a method of fabricating an electronic device such as a transistor.

The fabrication method comprises a step d) of forming a metallic oxide layer 2 on a substrate 1 so as to define a region for initiating the growth of semiconductor nanowires 34.

The method also comprises a step e) of forming one or more guide means for growing semiconductor nanowires 5. Each guide means connects the region 34 for initiating semiconductor nanowire growth to a region 35 for ending semiconductor nanowire growth so as to define a functional path.

The fabrication method comprises a step f) for fabricating one or more semiconductor nanowires 5 by implementing steps a), b), and c) so as to achieve guided growth of semiconductor nanowires 5 along respective guide means. During step c), each semiconductor nanowire 5 initiates or begins its growth at the semiconductor nanowire growth initiation region 34 and continues growth as far as the semiconductor nanowire growth end region 35.

Figure 19:
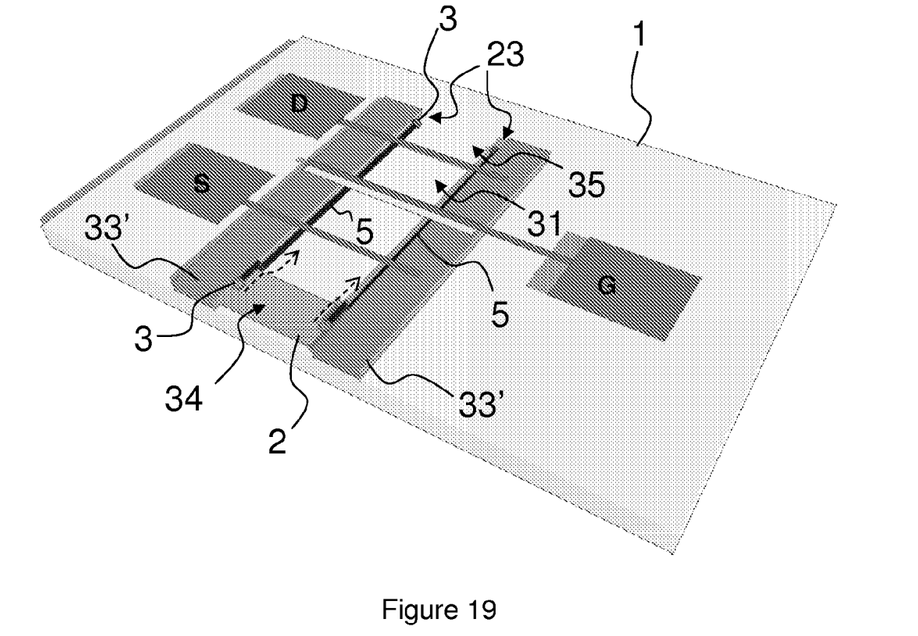
FIG. 19 is a diagram of a TFT/FET transistor obtained using the second guided lateral growth method of the invention.

FIG. 19 is a diagram of a thin film transistor/field effect transistor (TFT/FET) transistor obtained using this method of the invention.

The transistor comprises a source S, a drain D, and a gate G carried by a substrate 1.

In order to implement crystalline silicon nanowires 5 in the transistor, it is necessary to define the initial position for initiating or triggering the growth of nanowires 5, to control the morphology and the deployment of nanowires 5 directly in the functional circuit along a desired path, and to insulate the nanowires 5 electronically. The method is described in detail below.

Initially, an ITO covered region was defined as the region 34 for initiating semiconductor nanowire growth, i.e. the region from which growth of the nanowires 5 starts (step d)). This ITO covered region forms an ITO pad. ITO does not cover the entire substrate 1.

Thereafter, step e) was applied. The substrate 1 was covered by a layer 33 of dielectric material such as silicon nitride. This layer 33 of dielectric material may present a thickness lying in the range of 50 nm to 500 nm, for example. The dielectric material could be $SiO_2$, $HfO_2$, or a material having a high dielectric constant.

The deposition step followed by a layer 33 of dielectric material was followed by a step of etching the layer 33 of dielectric material in order to form a step 23 in the layer 33 of dielectric material.

In FIG. 19, windows 31 have been opened in the layer 33 of dielectric material, e.g. by ion etching. One of the windows 31 is open to the ITO region that is defined as the active region for initiating nanowire growth by an in-plane solid-liquid-solid (IPSLS) growth mechanism.

During this etching, the trenches or channels of dielectric material 33' having steps 23 were formed. These steps 23 serve to guide the growth of semiconductor nanowires 5. A portion of the ITO pad and a portion of the trench 33' of dielectric material are in contact. A portion of the trench 33' of dielectric material may cover part of the ITO pad.

Thereafter, step f) is applied. The ITO layer 2 is exposed to a hydrogen plasma during step a) in order to form metallic nanodrops 3 at the surface of the metallic oxide layer 2.

Thereafter a step b) is performed of local temperature plasma-assisted deposition of a thin layer 4 of semiconductor material.

In the example of FIG. 19, after this step b), a hydrogenated amorphous silicon layer (not shown) covers the ITO layer 2, the trench 33' of dielectric material, and the substrate 1.

Thereafter, during annealing step c), the two silicon nanowires 5 begin to develop and extend from the semiconductor nanowire growth initiation region 34 (the exposed ITO region) towards the semiconductor nanowire end-of-growth region 35.

The step 23 of each trench 33' of dielectric material traps the movement of a metallic nanodrop 3 and guides it along a functional path that is predefined by the shape of the step 23.

In the example of FIG. 19, this path is rectilinear.

During the guided growth process, the rectilinear appearance and the curvature of the nanowire 5 are under control. The number of channels for crystalline silicon nanowires 5 may also be controlled accurately.

The residual semiconductor material (a-Si:H) may be removed by low temperature hydrogen plasma etching (<100° C.), thereby preserving the crystallinity of the crystalline silicon nanowire 5.

In this example, the method of the invention obtains a transistor having two substantially parallel and rectilinear crystalline silicon nanowires 5 forming two transistor channels that are completely isolated electrically.

The source S, the drain D, and the gate G are then added to the substrate 1. The two crystalline silicon nanowires 5 form a semiconductive connection between the source 16, the drain 17, and the gate 18 of the transistor.

The trenches 33' of dielectric material serve to guide the growth of the nanowires 5 and also to isolate them electrically from the remainder of the electronic device.

Figure 20A:
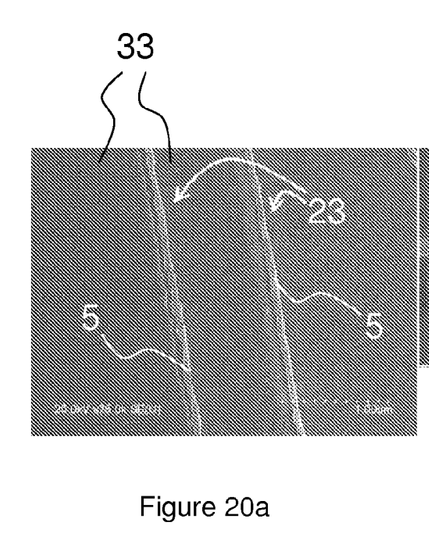
FIGS. 20a and 20b are respective SEM photographs of nanowires of an electronic device.
Figure 20B:
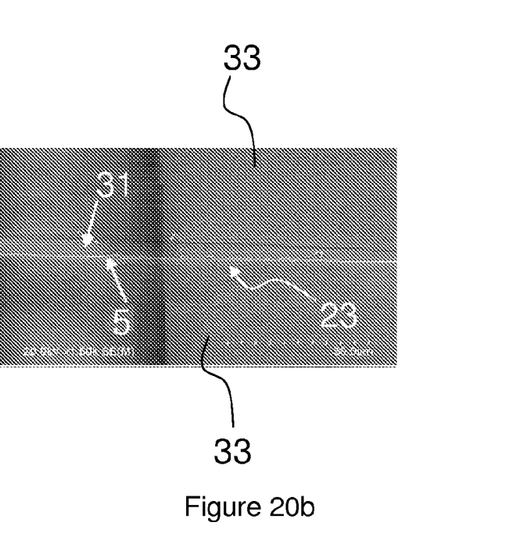

FIGS. 20a and 20b are respective SEM photographs of nanowires 5 of an electronic device.

FIG. 20a shows an electronic device having two steps 23 etched in a layer 33 of silicon nitride. The silicon nitride layer 33 was subsequently covered by a layer of amorphous silicon. Two straight crystalline silicon nanowires 5 are formed respectively along these two steps 23. After the crystalline silicon nanowires 5 had been grown, the amorphous silicon layer was removed by etching.

FIG. 20b shows an electronic device having one step 23 etched in the silicon nitride layer 33. A window 31 was opened in the silicon nitride layer 33 by etching to form a step 23. The silicon nitride layer 33 was subsequently covered by a layer of amorphous silicon. The crystalline silicon nanowire 5 grew along this step 23 and the amorphous silicon layer was removed by etching.

This example using silicon can be transposed to other materials, such as germanium, for example.

The method of the invention may also be used for electronic devices other than transistors, such as biological or mechanical sensors. Nanowires may act as optical waveguides, for example.

Thus, the method of the invention based on step formation (steps 23) makes it possible in effective manner to control the position, the path, the morphology, and the number of crystalline silicon nanowires 5.

A plurality of crystalline silicon nanowires 5 may be formed directly on a substrate in order to form a functional matrix of crystalline silicon nanowires 5, while maintaining the spatial and electronic isolation that are required to form an electronic device that is suitable for operating.

The crystalline silicon nanowires (5) may be doped by controlling the doping profile of each crystalline silicon nanowire 5 of a matrix of crystalline silicon nanowire 5.

The invention claimed is:

1. A method of fabricating semiconductor nanowires (5) on a substrate (1) including a metallic oxide layer (2), said semiconductor nanowires (5) extending on the surface of said substrate (1), comprising the following steps:
   a) exposing the metallic oxide layer (2) to a hydrogen plasma (11) of power P for a duration t suitable for reducing the layer (2) and for forming metallic nanodrops (3) of radius (Rm) on the surface of the metallic oxide layer (2);
   b) low temperature plasma-assisted deposition of a thin layer (4) of a semiconductor material on the metallic oxide layer (2) including the metallic nanodrops (3), said thin layer (4) having a thickness (Ha) suitable for covering the metallic nanodrops (3); and
   c) thermal annealing under vacuum at a temperature T higher than or equal to the melting temperature of the metallic nanodrops (3) so as to activate lateral growth of semiconductor nanowires (5) by catalysis of the semiconductor material deposited as a thin layer (4) from the metallic nanodrops (3) said lateral growth of said semiconductor nanowires (5) extending on the surface of said substrate (1) and being guided along the surface of the substrate,
   wherein the method includes a step of forming a guide prior to the thermal annealing step c), the lateral growth of the semiconductor nanowires (5) being guided along said guide along a predefined path and
   wherein forming the guide includes forming a channel (21) of semiconductor material, said channel forming said guide.

2. The method of fabricating nanowires (5) according to claim 1, wherein the step of forming the guide includes forming a step (23) on the substrate (1), said step (23) having a lateral wall (24) and forming said guide means.

3. A method of fabricating semiconductor nanowires (5) on a substrate (1) including a metallic oxide layer (2), said semiconductor nanowires (5) extending on the surface of said substrate (1), comprising the following steps:
   a) exposing the metallic oxide layer (2) to a hydrogen plasma (11) of power P for a duration t suitable for reducing the layer (2) and for forming metallic nanodrops (3) of radius (Rm) on the surface of the metallic oxide layer (2);
   b) low temperature plasma-assisted deposition of a thin layer (4) of a semiconductor material on the metallic oxide layer (2) including the metallic nanodrops (3), said thin layer (4) having a thickness (Ha) suitable for covering the metallic nanodrops (3); and
   c) thermal annealing under vacuum at a temperature T higher than or equal to the melting temperature of the metallic nanodrops (3) so as to activate lateral growth of semiconductor nanowires (5) by catalysis of the semiconductor material deposited as a thin layer (4) from the metallic nanodrops (3) said lateral growth of said semiconductor nanowires (5) extending on the surface of said substrate (1) and being guided along the surface of the substrate,
   wherein the method includes a step of forming a guide prior to the thermal annealing step c), the lateral growth of the semiconductor nanowires (5) being guided along said guide along a predefined path,
   wherein the step of forming the guide includes forming a step (23) on the substrate (1), said step (23) having a lateral wall (24) and forming said guide means,
   wherein the semiconductor nanowires grow laterally along the step at the junction formed between the lateral wall and the surface of the substrate, and
   wherein the method includes, between step a) and step b), a step of depositing a layer (33) of dielectric material, followed by a step of etching said layer of dielectric material (33) to form said step (23) in said layer of dielectric material (33).

4. A method of fabricating an electronic device including a substrate (1) according to claim 1, the method comprising the following steps:
   d) forming a layer (2) of metallic oxide on said substrate (1) so as to define a region (34) for initiating growth of semiconductor nanowires;
   e) forming one or more guide means for the growth of semiconductor nanowires (5), each guide means connecting the semiconductor nanowire growth initiation region (34) to a region (35) for ending semiconductor nanowire growth so as to define a functional path; and
   f) fabricating one or more semiconductor nanowires (5) in application of steps a), b), and c) so as to implement guided growth of semiconductor nanowires (5) along respective guide means during step c), each semiconductor nanowire (5) initiating its growth in the semiconductor nanowire growth initiation region (34) and continuing its growth to the semiconductor nanowire growth end region (35).

5. A method of fabricating an electronic device comprising semiconductor nanowires (5) on a substrate (1) including a metallic oxide layer (2), said semiconductor nanowires (5) extending on the surface of said substrate (1), comprising the following steps:
   a) exposing the metallic oxide layer (2) to a hydrogen plasma (11) of power P for a duration t suitable for reducing the layer (2) and for forming metallic nanodrops (3) of radius (Rm) on the surface of the metallic oxide layer (2);
   b) low temperature plasma-assisted deposition of a thin layer (4) of a semiconductor material on the metallic oxide layer (2) including the metallic nanodrops (3), said thin layer (4) having a thickness (Ha) suitable for covering the metallic nanodrops (3); and
   c) thermal annealing under vacuum at a temperature T higher than or equal to the melting temperature of the metallic nanodrops (3) so as to activate lateral growth of semiconductor nanowires (5) by catalysis of the semiconductor material deposited as a thin layer (4) from the metallic nanodrops (3) said lateral growth of said semiconductor nanowires (5) extending on the surface of said substrate (1) and being guided along the surface of the substrate;
   d) forming a layer (2) of metallic oxide on said substrate (1) so as to define a region (34) for initiating growth of semiconductor nanowires;
   e) forming one or more guide means for the growth of semiconductor nanowires (5), each guide means connecting the semiconductor nanowire growth initiation region (34) to a region (35) for ending semiconductor nanowire growth so as to define a functional path; and
   f) fabricating one or more semiconductor nanowires (5) in application of steps a), b), and c) so as to implement guided growth of semiconductor nanowires (5) along respective guide means during step c), each semiconductor nanowire (5) initiating its growth in the semiconductor nanowire growth initiation region (34) and continuing its growth to the semiconductor nanowire growth end region (35), and wherein during step e), between steps a) and b) a step is performed of depositing a layer (33) of dielectric material on the substrate (1) and the layer (2) of metallic oxide, this step of depositing a dielectric material layer (33) being followed by a step of etching said dielectric material (33) to form a step (23) in said dielectric material layer (33), said step (23) forming the guide means for the growth of semiconductor nanowires (5)

wherein the semiconductor nanowires grow laterally along the step at the junction formed between the lateral wall and the surface of the substrate.

6. A nanometric transistor (20) based on one or more semiconductor nanowires (5) obtained by the method according to claim 1, one of the nanowires (5) being suitable for forming a semiconductive connection between a source (16), a drain (17), and a gate (18) of said transistor.

7. A method of fabricating semiconductor nanowires (5) on a substrate (1) including a metallic oxide layer (2), said semiconductor nanowires (5) extending on the surface of said substrate (1), comprising the following steps:

a) exposing the metallic oxide layer (2) to a hydrogen plasma (11) of power P for a duration t suitable for reducing the layer (2) and for forming metallic nanodrops (3) of radius (Rm) on the surface of the metallic oxide layer (2);

b) low temperature plasma-assisted deposition of a thin layer (4) of a semiconductor material on the metallic oxide layer (2) including the metallic nanodrops (3), said thin layer (4) having a thickness (Ha) suitable for covering the metallic nanodrops (3); and c) thermal annealing under vacuum at a temperature T higher than or equal to the melting temperature of the metallic nanodrops (3) so as to activate lateral growth of semiconductor nanowires (5) by catalysis of the semiconductor material deposited as a thin layer (4) from the metallic nanodrops (3) said lateral growth of said semiconductor nanowires (5) extending on the surface of said substrate (1) and being guided along the surface of the substrate, wherein an equilibrium is obtained according to:

$$2 \cdot R_m \cdot H_a \cdot \alpha \cdot v_{ma} = S_{SiNW} \cdot v_{cm}$$

where:

$v_{cm}$ and $v_{ma}$ are travel speeds respectively of a crystal-metal interface and of a metal-amorphous interface;

$S_{SiNW}$ represents the effective cross-section area of the nanowires (5);

$R_m$ is the radius of the metallic droplets;

$H_a$ is the covering thickness of the layer (4); and $\alpha$ is a volume shrinkage during transformation of an amorphous phase to a crystalline phase of the substrate.

8. The method of fabricating semiconductor nanowires (5) according to claim 7, wherein a diameter of the nanowires (5) is proportional to a diameter of the nanodrops (3):

$$S_{SiNW} = f \cdot S_m = f \cdot \pi \cdot R_m^2$$

where f is a geometrical factor.

9. The method of fabricating semiconductor nanowires (5) according to claim 8, wherein a relationship between the travel speeds of the crystal-metal interface and the metal-amorphous interface:

$$\eta = v_{cm}/v_{ma} \approx A \cdot H_a/R_m$$

where:

$$A = 2 \cdot \alpha / \pi \cdot f.$$

10. The method of fabricating semiconductor nanowires (5) according to claim 1, wherein the semiconductor material deposited as a thin layer (4) is selected from silicon (Si), germanium (Ge), carbon (C), or an alloy of these materials (SiGe, SiC, or SiGeC), said semiconductor material being deposited in amorphous, micro- or poly-crystalline form.

11. The method of fabricating silicon nanowires (5) according to claim 10, wherein the material of the layer (4) is hydrogenated amorphous silicon (a-Si:H) having a thickness (Ha).

12. The method of fabricating carbon nanowires (5) according to claim 10, wherein the material of the layer (4) is hydrogenated amorphous carbon (a-C:H) having a thickness (Ha).

13. The method of fabricating nanowires (5) according to claim 10, wherein the metallic oxide (2) is an oxide of indium (InO), of tin (SnO2), of zinc (ZnO), of indium tin alloy (ITO), or a multilayer system of ZnO/ITO or ZnO/SnO2.

14. The method of fabricating nanowires (5) according to claim 1, wherein the radius (Rm) of the metallic nanodrops (3) is known and the duration of deposition of the semiconductor layer (4) is determined in such a manner as to obtain a predetermined ratio $\rho$ between the thickness (Ha) of the deposited layer (4) and the radius (Rm), the ratio $\rho$ being suitable for ensuring lateral growth of the nanowires (5).

15. The method of fabricating nanowires (5) according to claim 14, wherein the predetermined ratio $\eta$ is equal to 1 so that a morphology of the nanowires (5) is rectilinear over a length lying in a range of ten times a diameter of the nanowire (5) to more than 100 times the diameter of the nanowire (5).

16. The method of fabricating nanowires (5) according to claim 1, wherein the method further comprises a step of locally masking the metallic oxide layer (2) so as to form electrodes (14, 15), and in that the growth of a nanowire (5) is performed between two electrodes (14, 15).

17. A method of fabricating an electronic device including a substrate (1) according to claim 3, the method comprising the following steps:

d) forming a layer (2) of metallic oxide on said substrate (1) so as to define a region (34) for initiating growth of semiconductor nanowires;

e) forming one or more guide means for the growth of semiconductor nanowires (5), each guide means connecting the semiconductor nanowire growth initiation region (34) to a region (35) for ending semiconductor nanowire growth so as to define a functional path; and f) fabricating one or more semiconductor nanowires (5) in application of steps a), b), and c) so as to implement guided growth of semiconductor nanowires (5) along respective guide means during step c), each semiconductor nanowire (5) initiating its growth in the semiconductor nanowire growth initiation region (34) and continuing its growth to the semiconductor nanowire growth end region (35).

18. A nanometric transistor (20) based on one or more semiconductor nanowires (5) obtained by the method according to claim 3, one of the nanowires (5) being suitable for forming a semiconductive connection between a source (16), a drain (17), and a gate (18) of said transistor.

19. A nanometric transistor (20) based on one or more semiconductor nanowires (5) obtained by the method according to claim 5, one of the nanowires (5) being suitable for forming a semiconductive connection between a source (16), a drain (17), and a gate (18) of said transistor.

* * * * *